(12) United States Patent  
Tamagawa (10) Patent No.: US 7,102,678 B2
(45) Date of Patent: Sep. 5, 2006

(54) IMAGE READING DEVICE WITH REDUCED VARIATIONS AMONG SIGNAL LEVELS

(75) Inventor: Toshimitsu Tamagawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 812 days.

(21) Appl. No.: 09/971,054

(22) Filed: Oct. 5, 2001

(65) Prior Publication Data

US 2002/0044210 A1    Apr. 18, 2002

(30) Foreign Application Priority Data

Oct. 6, 2000    (JP)    ............................. 2000-307020

(51) Int. Cl.
- *H04N 5/335*    (2006.01)
- *H01L 31/00*    (2006.01)
- *H01L 31/0232*    (2006.01)

(52) U.S. Cl. ..................... 348/311; 257/452; 257/435

(58) Field of Classification Search ................ 348/294, 348/302, 311, 394, 317; 358/474; 257/291, 257/431–436, 452; 250/208.1

See application file for complete search history.

(56) References Cited

U.S. PATENT DOCUMENTS

| 5,349,216 | A | * | 9/1994 | Lee et al. ..................... 257/230 |
| 5,514,887 | A | * | 5/1996 | Hokari ........................ 257/222 |
| 5,696,626 | A | * | 12/1997 | Hosier et al. ................ 358/482 |
| 6,066,883 | A | * | 5/2000 | Hosier et al. ................ 257/452 |
| 6,157,019 | A | * | 12/2000 | Hosier ..................... 250/208.1 |
| 6,548,323 | B1 | * | 4/2003 | Perry et al. ................... 438/64 |
| 6,590,611 | B1 | * | 7/2003 | Ishida et al. ................ 348/310 |

* cited by examiner

*Primary Examiner*—David Ometz
*Assistant Examiner*—Kelly Jerabek
(74) *Attorney, Agent, or Firm*—Arent Fox PLLC (57) ABSTRACT

In an image reading device having a plurality of photoelectric conversion elements formed in one or more rows on an IC chip and a conductor layer having openings formed therein for limiting light striking the photoelectric conversion elements, a conductor having substantially the same width as the conductor layer is formed in the area extending from the photoelectric conversion element located at each end of the IC chip to the chip edge. This arrangement helps make light shield conditions nearly equal for the photoelectric conversion element located at an end of the IC chip and for the other photoelectric conversion elements.

7 Claims, 9 Drawing Sheets

IMAGE READING DEVICE WITH REDUCED VARIATIONS AMONG SIGNAL LEVELS

BACKGROUND OF THE INVENTION

1. Field of the Invention

The present invention relates to an image reading device, such as an image sensor, that converts optical information to an electric signal.

2. Description of the Prior Art

Figure 8:
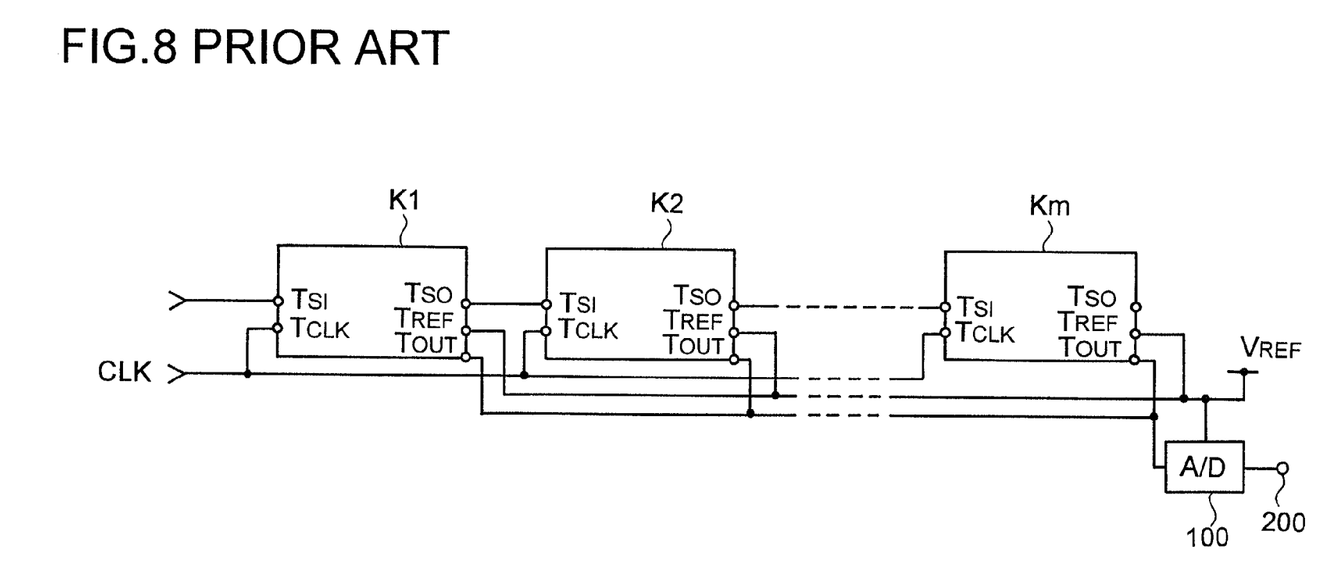
FIG. 8 is a diagram showing an outline of the circuit configuration of an image reading device.

As FIG. 8 shows, an image reading device is composed of IC chips $K_1, K_2, \ldots, K_m$, each having photoelectric conversion elements formed thereon, arranged in a row and mounted on a printed circuit board (not shown). The IC chips $K_1, K_2, \ldots, K_m$ sequentially output photoelectric conversion signals, which are then converted by an A/D converter 100 into a digital signal, which is then fed out via an output terminal 200. Conventionally, as the IC chips $K_1, K_2, \ldots, K_m$, IC chips of an identical configuration are used.

Figure 9A:
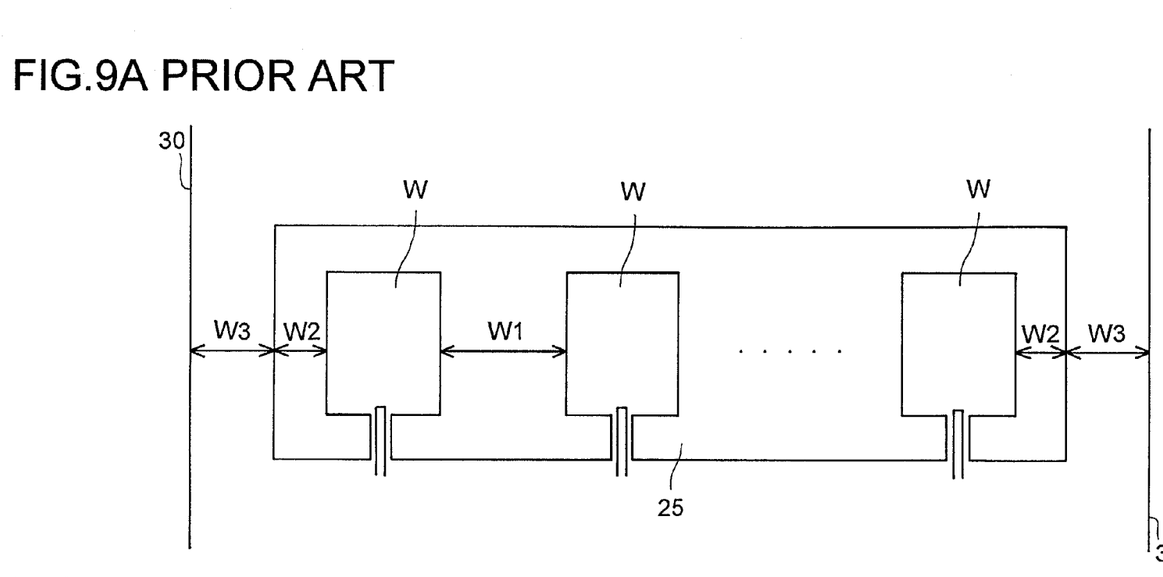
FIG. 9A is a diagram showing an example of the conventional structure of each of the IC chips constituting an image reading device.
Figure 9B:
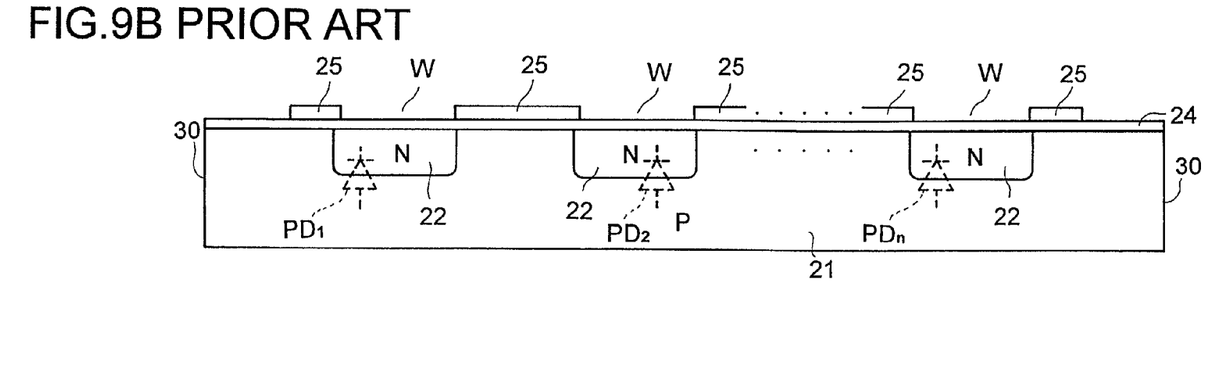
FIG. 9B is a sectional view of FIG. 9A.

Within each IC chip, as the photoelectric conversion elements, a plurality of photodiodes $PD_1, PD_2, \ldots, PD_n$ are formed in a row. FIGS. 9A and 9B are a top view and a sectional view, respectively, schematically showing such an IC chip. Here, a P-type substrate 21 serves as the anodes of the photodiodes $PD_1, PD_2, \ldots, PD_n$, and N-type regions 22 serve as the cathodes of the photodiodes $PD_1, PD_2, \ldots, PD_n$. On an insulating film 24, a metal conductor 25, such as one made of aluminum, is formed as a light shield film, with openings W left in positions corresponding to the N-type regions 22.

The conductor width W1 between two adjacent photodiodes is determined according to the resolution of the device as a whole. Moreover, to make the characteristics of the individual elements as uniform as possible, an identical pattern is formed repeatedly. As a result, the conductor width W2 on the chip edge 30 side of the photodiodes $PD_1$ and $PD_n$ located at both ends of the IC chip is equal to about one half of the conductor width W1 between two adjacent photodiodes.

Furthermore, conventionally, to prevent short-circuiting between the substrate 21 and the conductor 25 during scribing, no conductor, even including the conductor 25 serving as the light shield film, is formed in the areas covering a predetermined distance W3, defined in design rules, from the chip edges 30.

Accordingly, conventionally, as the resolution of the device becomes higher, the conductor width W2 secured on the chip edge 30 side of the photodiodes $PD_1$ and $PD_n$ located at both ends becomes narrower. This makes it more likely that unwanted light leaks in these photodiodes $PD_1$ and $PD_n$ obliquely from above and through the sides of the IC chip as compared with the other photodiodes.

As described above, light shield conditions differ between for the photodiodes located at both ends and for the other photodiodes, and therefore, even if uniform light is shone on all the photodiodes, the cathode voltages of the photodiodes at both ends are usually significantly lower than the cathode voltages of the other photodiodes. This causes great variations among the signal levels obtained from the individual photodiodes.

SUMMARY OF THE INVENTION

An object of the present invention is to provide an image reading device with reduced variations among the signal levels obtained from the individual photoelectric conversion elements thereof.

To achieve the above object, according to the present invention, in an image reading device having a plurality of photoelectric conversion elements formed in one or more rows on an IC chip and a conductor layer having openings formed therein for limiting light striking the photoelectric conversion elements, a conductor having substantially the same width as the conductor layer is formed in the area extending from the photoelectric conversion element located at each end of the IC chip to the chip edge. This arrangement helps make light shield conditions nearly equal for the photoelectric conversion element located at an end of the IC chip and for the other photoelectric conversion elements.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Hereinafter, embodiments of the present invention will be described with reference to the drawings. First, the circuit configuration of each of the IC chips constituting the image reading device of a first embodiment of the invention will be described with reference to FIG. 1.

Figure 1:
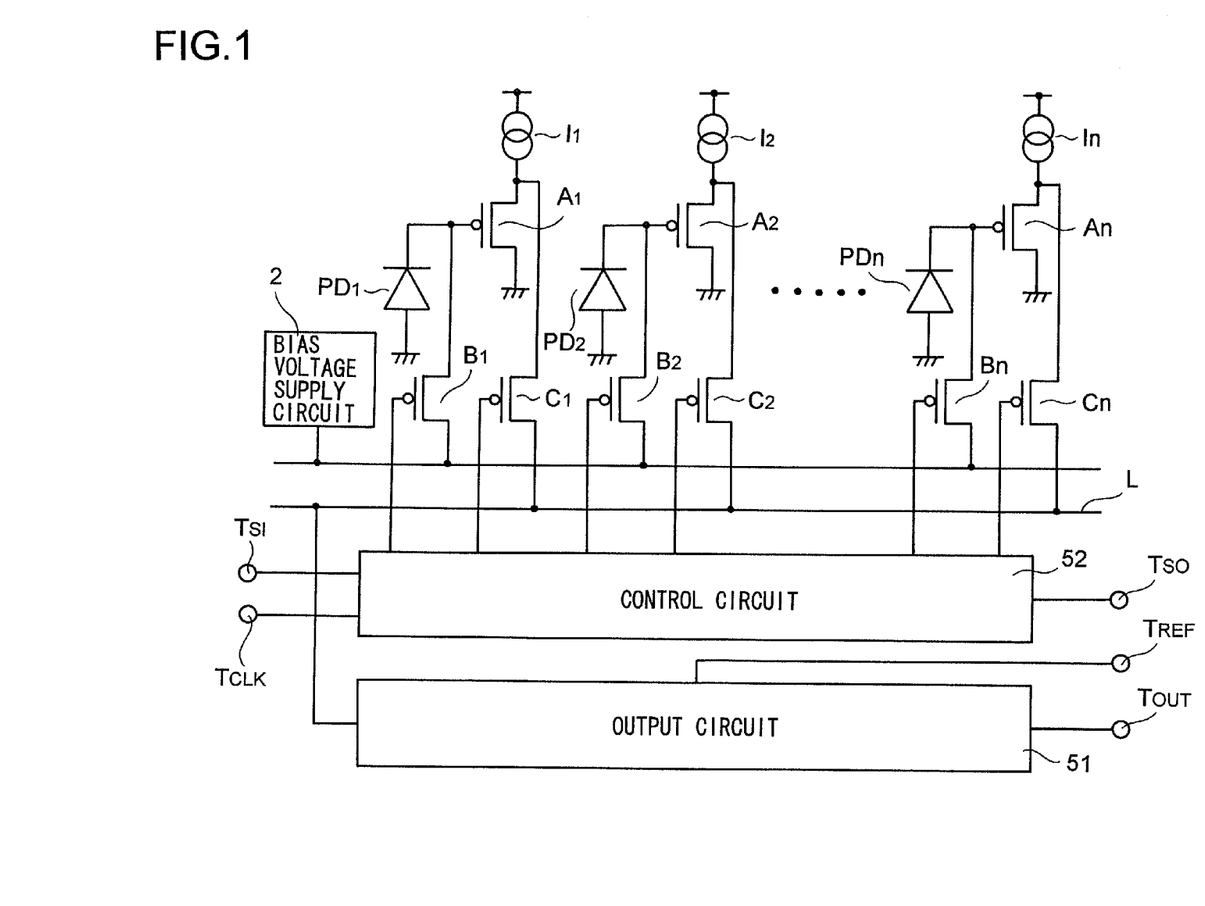
FIG. 1 is a diagram showing the circuit configuration of each of the IC chips constituting the image reading device of a first embodiment of the invention.

Photodiodes $PD_1, PD_2, \ldots, PD_n$, serving as photoelectric conversion elements, have their anodes connected to ground, and have their cathodes connected respectively to the gates of p-channel MOSFETs (metal-oxide semiconductor field-effect transistors) $A_1, A_2, \ldots, A_n$ for amplification. The transistors $A_1, A_2, \ldots, A_n$ receive, at their sources, constant currents respectively from constant-current sources $I_1, I_2, \ldots, I_n$, and have their drains connected to ground.

A bias voltage supply circuit 2 outputs a positive direct-current voltage stably. The voltage (hereinafter referred to as the "bias voltage") output from the bias voltage supply circuit 2 is applied, through the drain-source channels of p-channel MOSFETs $B_1, B_2, \ldots B_n$ for switching, to the cathodes of the photodiodes $PD_1, PD_2, \ldots, PD_n$ respectively.

In this circuit configuration, when the transistor $B_x$ (x=1, 2, ..., n) remains on for a predetermined time or longer, a reverse bias is applied to the photodiode $PD_x$, and thus a predetermined amount of electric charge is accumulated therein. In the following descriptions, this will be depicted as "the photodiode $PD_x$ being initialized."

When the transistor $B_x$ turns from on to off, the initialization of the photodiode $PD_x$ is broken off, and the accumulated electric charge is discharged in proportion to the amount of incident light, causing a current to flow. Thus, the photodiode $PD_x$ gives a voltage proportional to the amount of incident light.

Moreover, a transistor $C_x$ turns on, with the result that the voltage signal (hereinafter referred to simply as "the signal of the photodiode $PD_x$") at the cathode of the photodiode $PD_x$ is amplified by a source-follower circuit formed by the transistor $A_x$, is then subjected to further amplification, waveform shaping, and other processing by an output circuit 51, and is then fed out via a terminal $T_{OUT}$ (hereinafter, this will be depicted as "the signal of the photodiode $PD_x$ being read out").

A control circuit 52 controls the transistors $C_x$ in such a way that the signals of the photodiodes $PD_1, PD_2, \ldots, PD_n$ are output sequentially, and also controls the transistors Bx in such a way that the photodiode $PD_x$ is initialized every time the signal of this photodiode $PD_x$ is read out.

Figure 2:
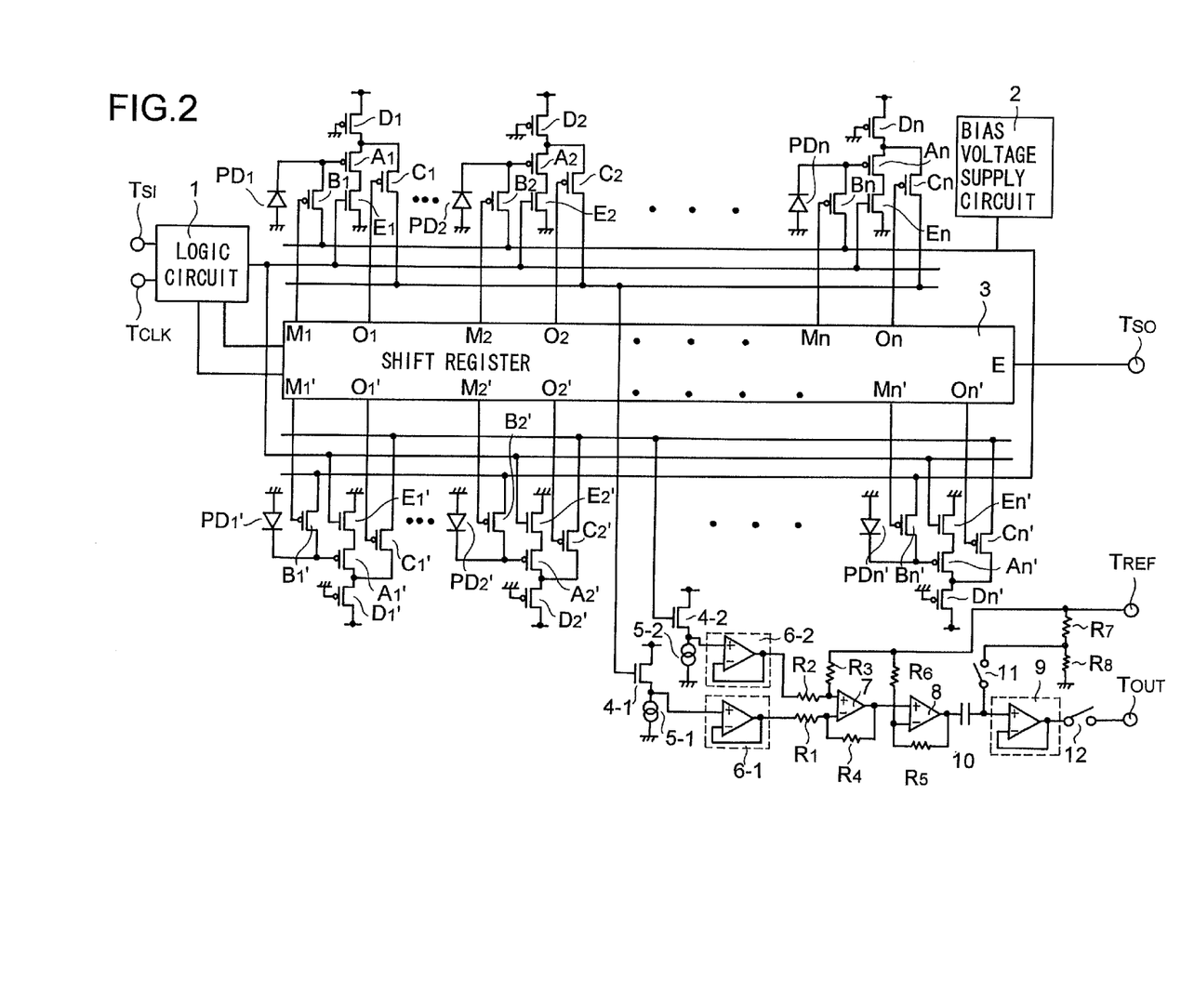
FIG. 2 is a diagram showing the circuit configuration of each of the IC chips constituting the image reading device of a second embodiment of the invention.

Next, the circuit configuration of each of the IC chips constituting the image reading device of a second embodiment of the invention will be described with reference to FIG. 2. Photodiodes $PD_1, \ldots, PD_n, PD_1', \ldots, PD_n'$ serving as photoelectric conversion elements, have their anodes connected to ground, and have their cathodes connected respectively to the gates of p-channel MOSFETs $A_1, \ldots, A_n, A_1', \ldots, A_n'$ for amplification.

Here, the photodiodes $PD_1', \ldots, PD_n'$ have their light-receiving surfaces shielded so as not to be involved in image reading. In the following descriptions, these photodiodes will be referred to also as the "dummy photodiodes." On the other hand, the photodiodes $PD_1, \ldots, PD_n$ do not have their light-receiving surfaces shielded, and are used in image reading. In the following descriptions, these photodiodes will be referred to also as the "image reading photodiodes."

The transistors $A_1, \ldots, A_n, A_1', \ldots, A_n'$ have their sources connected, through the drain-source channels of p-channel MOSFETs $D_1, \ldots, D_n, D_1', \ldots D_n'$ respectively, to a supply voltage. The transistors $D_1, \ldots, D_n, D_1', \ldots, D_n'$ have their gates connected to ground, and the transistors $A_1, \ldots, A_n, A_1', \ldots, A_n'$ receive constant currents at their sources.

The transistors $A_1, \ldots, A_1', \ldots, A_n'$ have their drains connected, through the drain-source channels of n-channel MOSFETs $E_1, \ldots, E_n, E_1', \ldots, E_n'$ respectively, to ground. A logic circuit 1 controls the transistors $E_1, \ldots E_n, E_1', \ldots, E_n'$ in such a way that they remain on only from immediately before the start of the reading of the signal from the first image reading photodiode $PD_1$ until the completion of the reading of the signal from the last image reading photodiode $PD_n$. This helps reduce electric power consumption.

A bias voltage (i.e. a stable direct-current voltage output from a bias voltage supply circuit 2) is applied, through the drain-source channels of p-channel MOSFETs $B_1, \ldots, B_n, B_1', \ldots, B_n'$ for switching, to the cathodes of the photodiodes $PD_1, \ldots, PD_n, PD_1', \ldots, PD_n'$ respectively. The transistors $B_1, \ldots, B_n, B_1', \ldots, B_n'$ respectively receive, at their gates, signals output from terminals $M_1, \ldots, M_n, M_1', \ldots, M_n'$ of a shift register 3.

The transistors $A_1, A_2, \ldots, A_n$ have their sources connected, respectively through the drain-source channels of p-channel MOSFETs $C_1, C_2, \ldots, C_n$ for switching, together to the gate of an n-channel MOSFET 4-1. The transistors $A_1', A_2', \ldots, A_n'$ have their sources connected, respectively through the drain-source channels of p-channel MOSFETs $C_1', C_2', \ldots, C_n'$ for switching, together to the gate of an n-channel MOSFET 4-2.

The transistors $C_1, \ldots, C_n, C_1', \ldots, C_n'$ respectively receive, at their gates, signals output from terminals $O_1, \ldots, O_n, O_1'$ of the shift register 3. The sources of the transistors 4-1 and 4-2 are connected, through constant current sources 5-1 and 5-2 respectively, to ground. The drains of the transistors 4-1 and 4-2 are connected to the supply voltage.

Buffer amplifiers 6-1 and 6-2 are each composed of an operational amplifier having its output fed back to its own inverting input terminal (−). The input sides of the buffer amplifiers 6-1 and 6-2 (i.e. the non-inverting input terminal (+) of each operational amplifier) are connected to the sources of the transistors 4-1 and 4-2 respectively.

That is, the signals of the image reading photodiodes $PD_x$ (x=1, 2, ..., n) are fed, through the source follower circuits formed by the transistors $A_x$ respectively, and then through the source follower circuit formed by the transistor 4-1, to the buffer amplifier 6-1. On the other hand, the signals of the dummy photodiodes $PD_x'$ are fed, through the source follower circuits formed by the transistors $A_x'$ respectively, and then through the source follower circuit formed by the transistor 4-2, to the buffer amplifier 6-2.

The output side (the output terminal of the operational amplifier) of the buffer amplifier 6-1 is connected through a resistor $R_1$ to the inverting input terminal (−) of an operational amplifier 7. The output side of the buffer amplifier 6-2 is connected through a resistor $R_2$ to the non-inverting input terminal (+) of the operational amplifier 7.

To the non-inverting input terminal (+) of the operational amplifier 7, a direct-current reference voltage is fed from outside the IC chip via a terminal $T_{REF}$ thereof through a resistor $R_3$. The output terminal of the operational amplifier 7 is connected through a resistor $R_4$ to its own inverting input terminal (−), and also to the non-inverting input terminal (+) of an operational amplifier 8.

To the inverting input terminal (−) of the operational amplifier 8, its own output terminal is connected through a resistor $R_5$, and also the reference voltage fed from outside via the terminal $T_{REF}$ is applied through a resistor $R_6$.

A buffer amplifier 9 is composed of an operational amplifier with its output fed back to its own inverting input terminal (−). To the input side of the buffer amplifier 9, the output terminal of the operational amplifier 8 is connected through a capacitor 10. Moreover, the input side of the buffer amplifier 9 is connected through a switch 11 to the node between resistors $R_7$ and $R_8$ that are connected in series between the terminal $T_{REF}$, to which the reference voltage is applied from outside, and ground.

The switch 11 is composed of, for example, an analog switch, and is controlled by the logic circuit 1 in such a way as to remain on only for a predetermined time before the start of the reading of the first image reading photodiode $PD_1$.

The output of the buffer amplifier 9 is fed out through a switch 12 via a terminal $T_{OUT}$ of the IC chip. The switch 12 is composed of, for example, an analog switch, and is controlled by the logic circuit 1 in such a way as to remain on only from immediately before the start of the reading of the signal from the first image reading photodiode $PD_1$ until the completion of the reading of the signal from the last image reading photodiode $PD_n$.

The logic circuit 1 receives a clock signal CLK fed in from outside via a terminal $T_{CLK}$ of the IC chip and a start trigger signal ST fed in from outside via a terminal $T_{SI}$ of the IC chip. The clock signal CLK fed to the individual IC chips are common to all of them. On the basis of the clock signal CLK and the start trigger signal ST fed thereto, the logic circuit 1 controls the transistors $E_x$ and the switches 11 and 12 in the manner described above.

Figure 3:
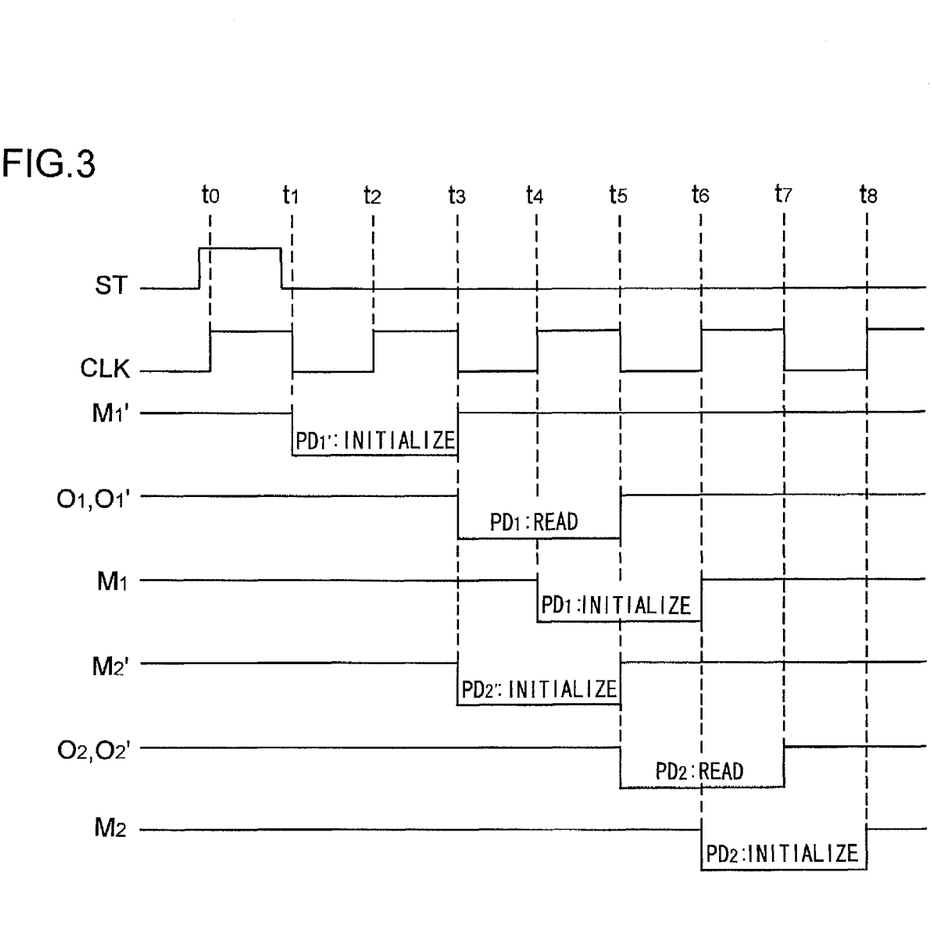
FIG. 3 is a timing chart of relevant signals in each of the IC chips constituting the image reading device of the second embodiment.

The start trigger signal ST, fed in via the terminal $T_{SI}$ of the IC chip, and the clock signal CLK, fed in via the terminal $T_{CLK}$ of the IC chip, are also fed through the logic circuit 1 to the shift register 3. As FIG. 3 shows, the shift register 3 sequentially outputs, in synchronism with the second and following trailing edges of the clock signal CLK after the rising edge of the start trigger signal ST, negative pulses, each having a pulse width equal to one period of the clock signal CLK, via its terminals $O_1, O_2, \ldots, O_n$. The shift register 3 outputs the same signals as it outputs via its terminals $O_1, O_2, \ldots, O_n$ also via its terminals $O_1', O_2', \ldots, O_n'$.

As a result, the transistors $C_1$ and $C_1'$, the transistors $C_2$ and $C_2', \ldots$, the transistors $C_n$ and $C_n'$ are sequentially kept on for one period of the clock signal CLK one pair after another, specifically in such a way that the transistors $C_1$ and $C_1'$ remain on between time points $t_3$ and $t_5$, the transistors $C_2$ and $C_2'$ remain on between time points $t_5$ and $t_7$, and so forth. Thus, the signals of the image reading photodiodes $PD_1, PD_2, \ldots, PD_n$ are sequentially fed to the gate of the transistor 4-1, and the signals of the dummy photodiodes $PD_1', PD_2', \ldots, PD_n'$ are sequentially fed to the gate of the transistor 4-2.

Moreover, as FIG. 3 shows, the shift register 3 also sequentially outputs, in synchronism with the third and following rising edges of the clock signal CLK after the rising edge of the start trigger signal ST, negative pulses, each having a pulse width equal to one period of the clock signal CLK, via its terminals $M_1, M_2, \ldots, M_n$.

As a result, the transistors $B_1, B_2, \ldots, B_n$ are sequentially kept on for one period of the clock signal CLK one after another, specifically in such a way that the transistor $B_1$ remains on between time points $t_4$ and $t_6$, the transistor $B_2$ remains on between time points $t_6$ and $t_8$, and so forth. Thus, the image reading photodiodes $PD_1, PD_2, \ldots, PD_n$ are initialized sequentially.

In this way, if one pays attention to the first image reading photodiode $PD_1$, whereas the transistor $C_1$ is kept on between time points $t_3$ and $t_5$ so that the signal of the photodiode $PD_1$ is read out, the transistor $B_1$ is also kept on between time points $t_4$ and $t_5$ (i.e. during the last half of the read period) so that the photodiode $PD_1$ is initialized. Thus, only the signal read out between time points $t_3$ and $t_4$ (i.e. during the first half of the read period) is actually used. Likewise, also with the other image reading photodiodes $PD_2, PD_3, \ldots, PD_n$, only the signals read out during the first half of their respective read period are actually used.

Moreover, as FIG. 3 shows, the shift register 3 also sequentially outputs, in synchronism with the trailing edges of the clock signal CLK after the rising edge of the start trigger signal ST, negative pulses, each having a pulse width equal to one period of the clock signal CLK, via its terminals $M_1', M_2', \ldots, M_n'$.

As a result, the transistors $B_1', B_2', \ldots, B_n'$ are sequentially kept on for one period of the clock signal CLK one after another, specifically in such a way that the transistor $B_1'$ remains on between time points $t_1$ and $t_3$, the transistor $B_2'$ remains on between time points $t_3$ and $t_5$, and so forth. Thus, the dummy photodiodes $PD_1', PD_2', \ldots, PD_n'$ are initialized sequentially.

Moreover, the shift register 3 outputs, at its terminal E, a signal, which is fed out of the IC chip via its terminal $T_{SO}$ so as to be fed to the terminal $T_{SI}$ of the next IC chip. That is, this signal is used as the start trigger signal ST in the next IC chip. Here, the shift register 3 outputs one positive pulse via its terminal E with such appropriate timing as to prevent interference between the reading of the signal of the last image reading photodiode $PD_n$ of the IC chip under discussion and the reading of the signal of the first image reading photodiode $PD_1$ of the next IC chip.

In this circuit configuration, the differences between the signals of the image reading photodiodes PDx and the signals of the corresponding dummy photodiodes PDx1 are output. Thus, even if there are variations, inevitable in the manufacture of the device, among the signal levels obtained from the photodiodes within each IC chip or from one IC chip to another, they are canceled. This makes the obtained signal levels uniform as compared with those obtained in the circuit configuration of the first embodiment.

Figure 4A:
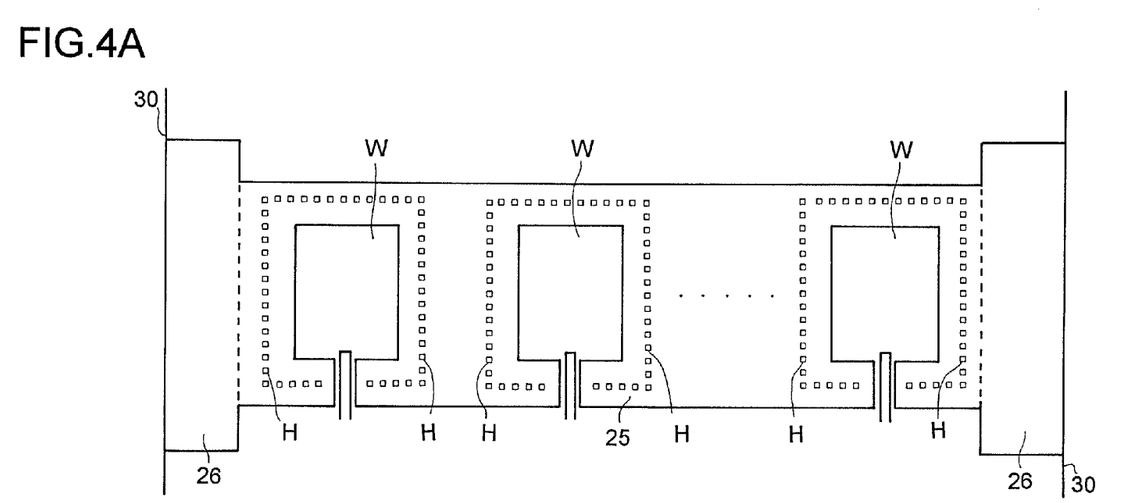
FIG. 4A is a plan view showing an example of the structure of each of the IC chips constituting the image reading devices of the first and second embodiments.
Figure 4B:
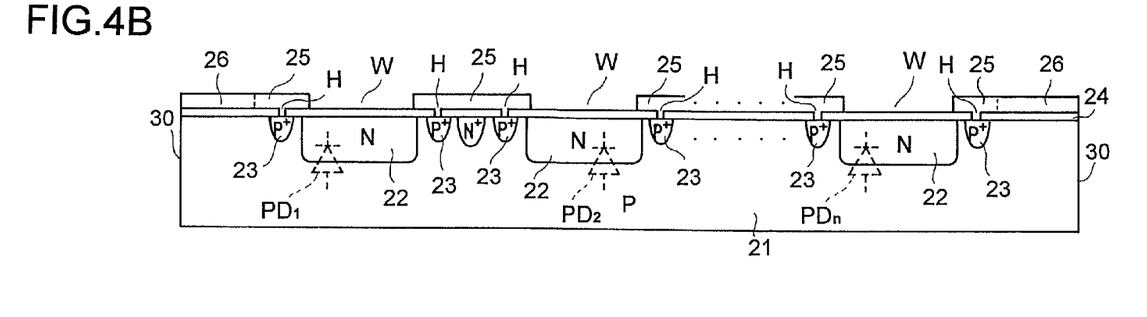
FIG. 4B is a sectional view of FIG. 4A.

FIGS. 4A and 4B show a top view and a sectional view, respectively, of a portion corresponding to the image reading photodiodes $PD_1, PD_2, \ldots, PD_n$ of each of the IC chips constituting the image reading devices of the first and second embodiments described above. On an insulating film 24, a metal conductor 25, such as one made of aluminum, is formed so as to connect a P-type substrate 21, which serves as the anodes of the photodiodes $PD_1, PD_2, \ldots, PD_n$, to ground through $P^+$-type contact regions 23 formed around N-type regions 22, which serve as the cathodes of the photodiodes $PD_1, PD_2, \ldots, PD_n$. The conductor 25 has openings W formed therein to permit light to strike on the N-type regions 22.

On the chip edge 30 side of the photodiodes $PD_1$ and $PD_n$ located at both ends of the IC chip, conductors 26 are formed integrally with the conductor 25 in such a way that the outer ends of the conductors 26 coincide with the chip edges 30. That is, on the chip edge 30 side of the photodiodes $PD_1$ and $PD_n$, the conductors 26 are formed so as to reach the chip edges 30.

Thus, with respect to the image reading photodiodes $PD_1, PD_2, \ldots, PD_n$, the portions between the photodiodes $PD_1$ and $PD_n$ located at both ends and the chip edges 30 are shielded from light by the conductors 26. This reduces the amount of unwanted light that leaks in the photodiodes $PD_1$ and $PD_n$ at both ends obliquely from above, and makes it difficult for the unwanted light that has entered the IC chip through the sides thereof to reach the photodiodes $PD_1$ and $PD_n$ at both ends. In this way, it is possible to make light shield conditions nearly equal for the photodiodes $PD_1$ and $PD_n$ at both ends and for the other photodiodes, and thereby reduce variations among the signal levels obtained.

In FIGS. 4A and 4B, as described above, the conductors 25 and 26 are formed integrally, and the conductors 26 are formed so as to reach the chip edges 30. This may cause short-circuiting between the substrate 21 and the conductor 25 during scribing. However, in FIGS. 4A and 4B, this does not pose a problem because the substrate 21 and the conductor 25 are at the same potential.

Figure 5:
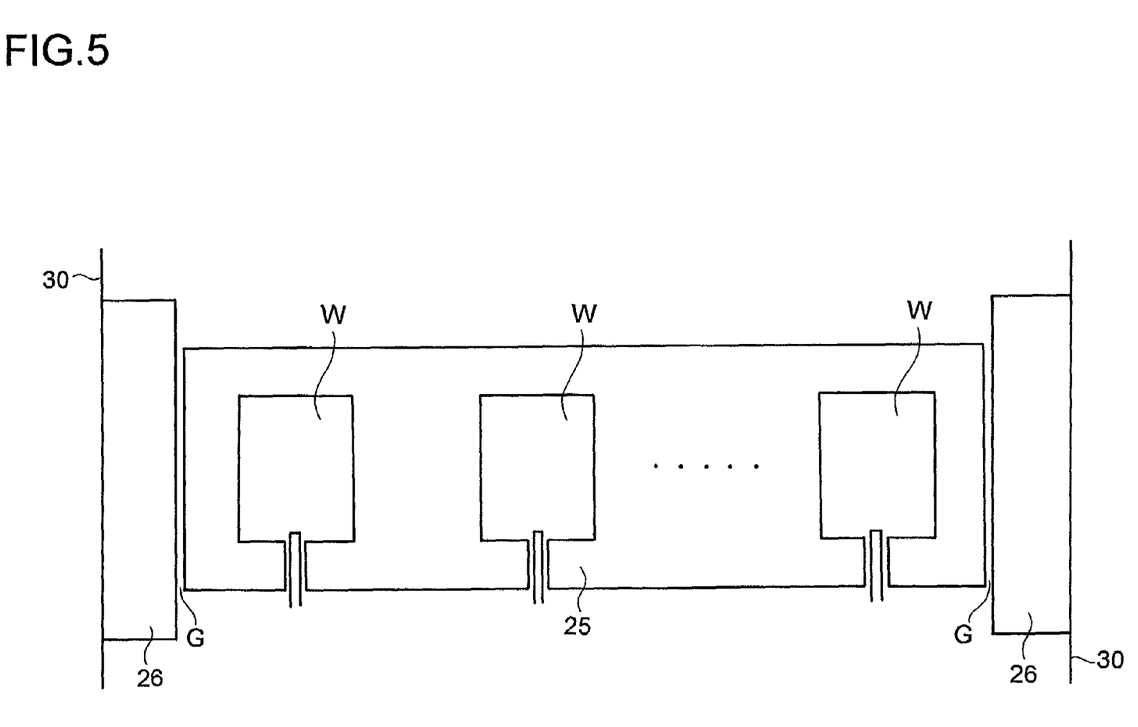
FIG. 5 is a diagram showing another example of the structure of each of the IC chips constituting the image reading devices of the first and second embodiments.

On the other hand, in cases where the substrate 21 and the conductor 25 are at different potentials, it is possible, as FIG.

Figure 6:
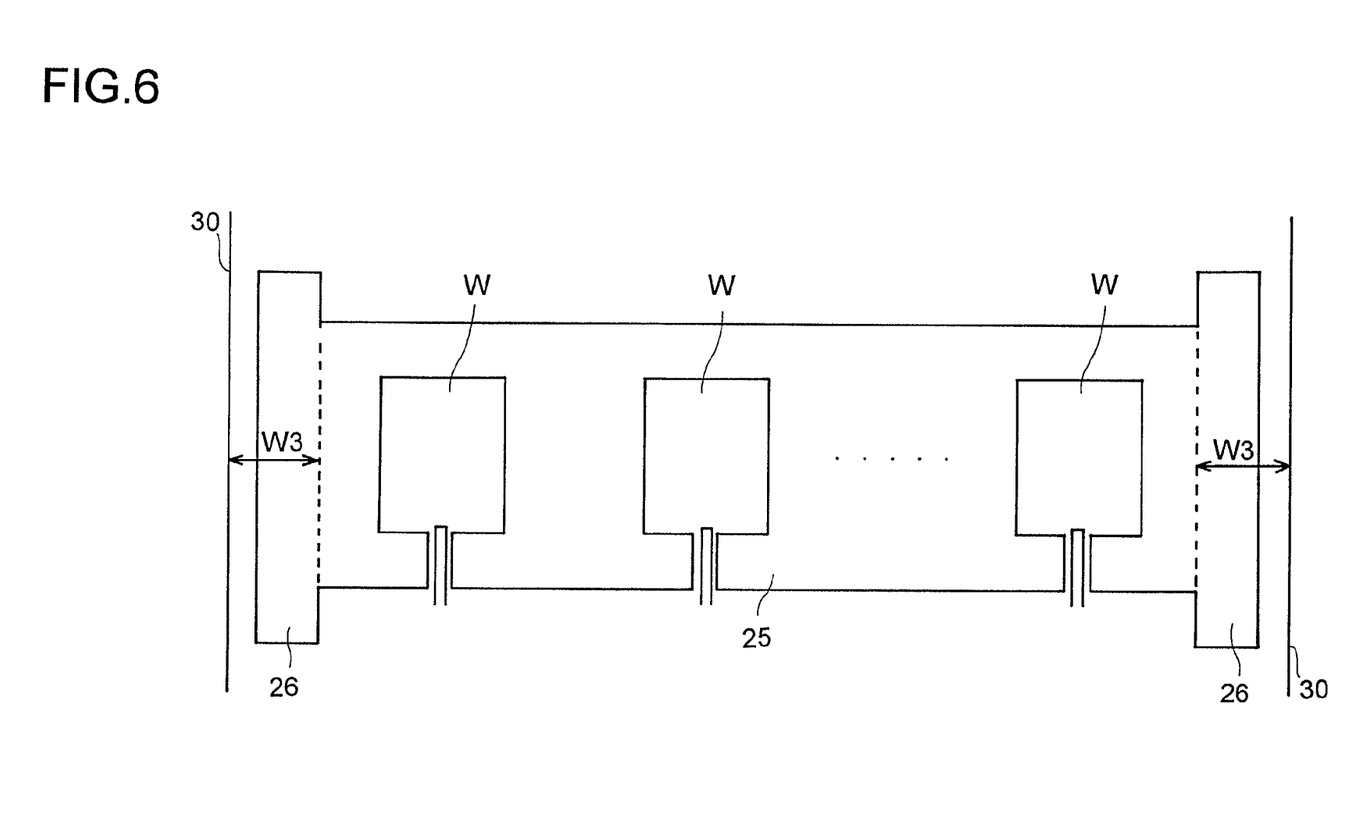
FIG. 6 is a diagram showing still another example of the structure of each of the IC chips constituting the image reading devices of the first and second embodiments.

5 shows, to secure between conductors 25 and 26 gaps G sufficiently small as compared with the conductor width secured on the chip edge 30 side of the photodiodes $PD_1$ and $PD_n$ located at both ends, and form the conductors 26 fully up to the chip edges 30. Alternatively, it is possible, as FIG. 6 shows, to form the conductors 26 short of the chip edges 30 but still well into the areas covering the distance W3 from the chip edges 30 where no other conductor is supposed to be formed by design rules.

The conductors 26 may be formed only in the vicinity of the photodiodes $PD_1$ and $PD_n$ at both ends along the chip edges 30, or may be formed all along the chip edges 30. Even in cases where the substrate 21 and the conductor 25 are at the same potential, the conductors 26 may be formed as shown in FIG. 5 or 6.

Likewise, also with the dummy photodiodes $PD_1'$, $PD_2'$, ..., $PD_n'$, the portions between the photodiodes at both ends and the chip edges may be shielded from light in the same manner as with the image reading photodiodes $PD_1$, $PD_2$, ..., $PD_n$. In this way, it is possible to make light shield conditions nearly equal for the photodiodes at both ends and for the other photodiodes, and thereby further reduce variations among the signal levels obtained.

Another point to be noted is that, as FIG. 4 shows, contact holes H for connecting the P-type substrate 21, which serves as the anodes of the image reading photodiodes $PD_1$, $PD_2$, ..., $PD_n$, to the conductor 25 are preferably formed at predetermined intervals in a row in the insulating film 24 in such a way as to surround the image reading photodiodes $PD_1$, $PD_2$, ..., $PD_n$. In this arrangement, even if light enters the image reading photodiodes through openings other than the openings formed on themselves, it is shut off by the conductor material that fills the contact holes H. In this way, it is possible to make light shield conditions more nearly equal for the individual image reading photodiodes, and thereby further reduce variations among the signals levels obtained.

Figure 7A:
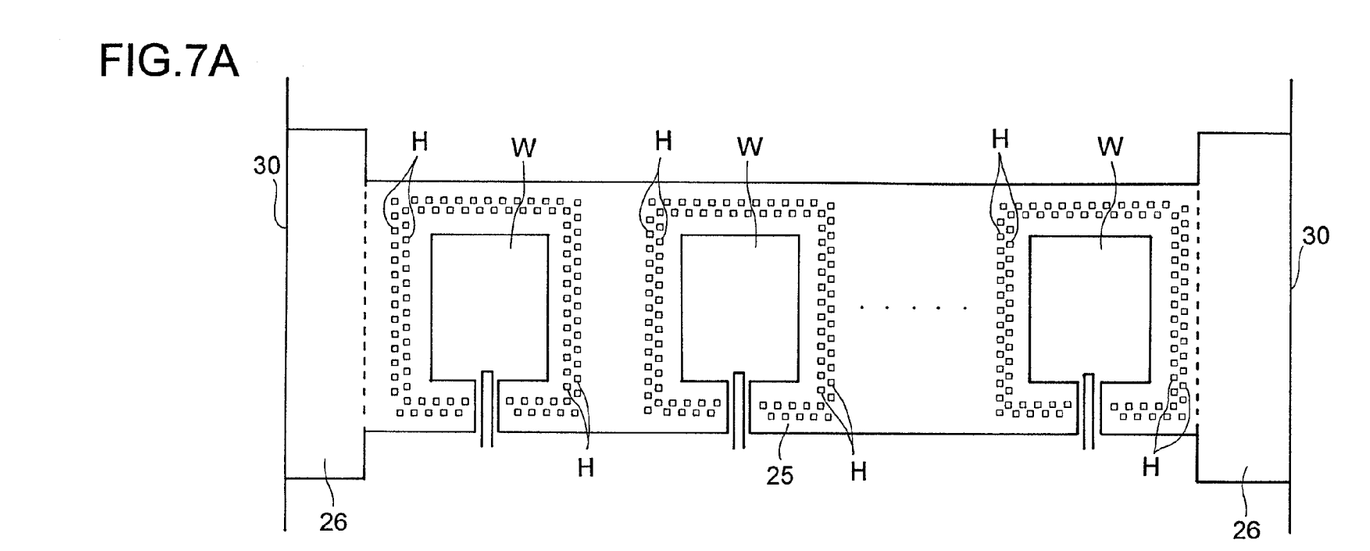
FIG. 7A is a diagram showing a further example of the structure of each of the IC chips constituting the image reading devices of the first and second embodiments.
Figure 7B:
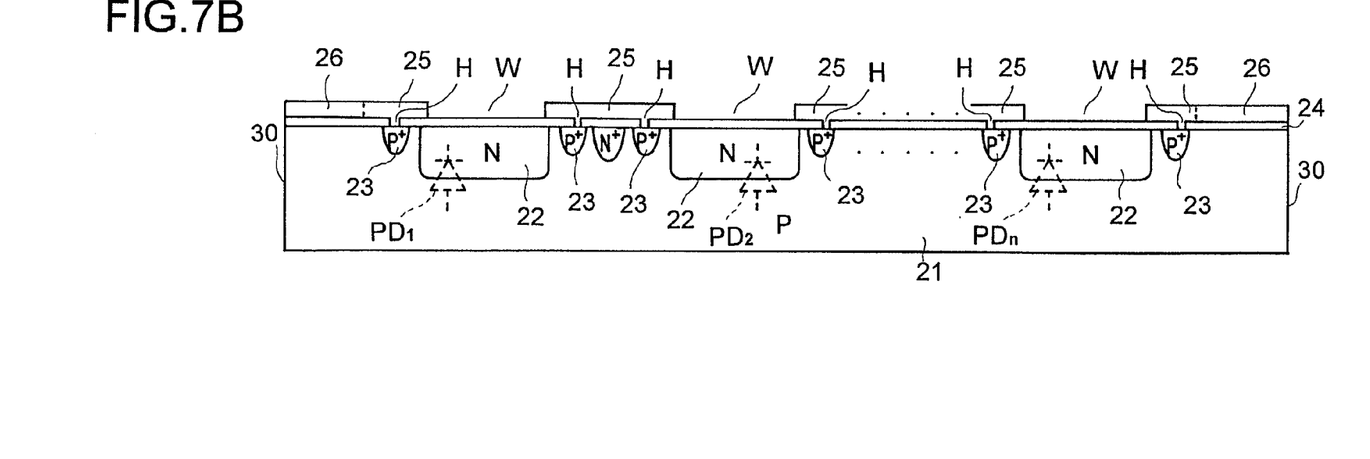
FIG. 7B is a sectional view of FIG. 7A.

Alternatively, as FIGS. 7A and 7B show, the contact holes may be formed in two or more rows (in FIGS. 7A and 7B, in two rows) in such a way that between two adjacent contact holes of one row comes a contact hole of another row. This arrangement is more effective in shutting off the light that enters the image reading photodiodes through openings other than the openings formed on themselves.

By forming the anode conductor and the contact holes in the same manner as described above also for the dummy photodiodes, it is possible to make light shield conditions more nearly equal for the dummy photodiodes, and thereby further reduce variations among the signal levels obtained.

The present invention may be implemented in any other manner than is specifically described above as embodiments. For example, it is possible to completely omit dummy photodiodes, or provide only one dummy photodiode common to all the image reading photodiodes and output the differences between the signals of the individual image reading photodiodes and the signal of the dummy photodiode. This helps simplify the circuit configuration, and thus contributes to miniaturization and cost reduction.

Providing as many dummy photodiodes as image reading photodiodes, however, makes it possible to arrange the dummy photodiodes close to the corresponding image reading photodiodes. Thus, in this arrangement, outputting the differences between the signals of the image reading photodiodes and the signals of the dummy photodiodes arranged close thereto makes it possible to reduce variations among the signal levels obtained within the same IC chip due to variations in the characteristics of the individual elements.

As described above, according to the present invention, in an image reading device composed of IC chips each having a plurality of photoelectric conversion elements formed in a row thereon, it is possible to make light shield conditions nearly equal for the photoelectric conversion elements located at both ends of the IC chips and for the other photoelectric conversion elements. This makes it possible to reduce variations in the signal levels obtained from the individual photoelectric conversion elements.

What is claimed is:

1. An image reading device having a plurality of photoelectric conversion elements formed in one or more rows on an IC chip and a metal conductor layer having openings formed therein for limiting light striking the photoelectric conversion elements,
   wherein the metal conductor layer is formed around the openings individually so as to prevent light from striking the photoelectric conversion elements except through the openings and electrically connected to one terminal of the plurality of photoelectric conversion elements, and
   wherein a metal conductor having substantially a same width as the metal conductor layer is formed integrally with the metal conductor layer in an area extending from a photoelectric conversion element located at an end of the row to an edge of the IC chip, and
   wherein a semiconductor substrate on which the photoelectric conversion elements are formed, the metal conductor layer, and the metal conductor are maintained at a same potential.

2. An image reading device comprising an IC chip, the IC chip comprising:
   a plurality of photoelectric conversion elements arranged at predetermined intervals in one or more rows on the IC chip and having an opening each;
   a first metal conductor layer formed around the openings individually to prevent light from striking the photoelectric conversion elements except through the openings and electrically connected to one terminal of the plurality of photoelectric conversion elements; and
   a second metal conductor layer having substantially a same width as the first metal conductor layer and formed between an edge of the IC chip and the first metal conductor layer in an area extending from a photoelectric conversion element located at an end of the row to the edge of the IC chip so as to shut off light coming obliquely from above in a direction of the edge of the IC chip, and
   wherein a semiconductor substrate on which the photoelectric conversion elements are formed, the first metal conductor layer, and the second metal conductor layer are maintained at a same potential.

3. An image reading device as claimed in claim 2, wherein the second metal conductor layer is formed continuously starting from the edge of the IC chip.

4. An image reading device as claimed in claim 2, wherein the second metal conductor layer is formed staring from the chip edge, and is insulated from the first metal conductor layer by a gap secured in between.

5. An image reading device as claimed in claim 2, wherein the second metal conductor layer is insulated from the chip edge by a gap secured in between, and is connected to the first metal conductor layer by being formed continually therewith.

6. An image reading device comprising an IC chip, the IC chip comprising:
- a semiconductor substrate on which elements are formed;
- a plurality of photoelectric conversion elements arranged at predetermined intervals in one or more rows on the semiconductor substrate;
- an insulating layer formed over substantially an entire surface of the IC chip on and around the photoelectric conversion elements;
- a first metal conductor layer formed on a surface of the insulating layer with openings formed above the photoelectric conversion elements and in such a way as to surround the openings, the first metal conductor layer serving to prevent light from striking the photoelectric conversion elements except through the openings;
- a second metal conductor layer having substantially a same width as the first metal conductor layer and formed between an edge of the IC chip and the first metal conductor layer in an area extending from a photoelectric conversion element located at an end of the row to the edge of the IC chip so as to shut off light coming obliquely from above in a direction of the edge of the IC chip; and
- a plurality of contact holes formed at predetermined intervals in at least one row in the insulating layer so as to surround each of the openings individually along every side thereof, the contact holes serving to connect the first metal conductor layer to the semiconductor substrate and simultaneously preventing light from striking the photoelectric conversion elements through openings other than the openings formed right above the respective photoelectric conversion elements.

7. An image reading device as claimed in claim 2, further comprising:
- an insulating layer formed over substantially an entire surface of the IC chip on and around the plurality of photoelectric conversion elements; and
- a plurality of contact holes formed at predetermined intervals in at least one row in the insulating layer so as to surround each of the openings individually along every side thereof, the contact holes serving to connect the first metal conductor layer to the semiconductor substrate and simultaneously preventing light from striking the photoelectric conversion elements through openings other than particular openings.

* * * * *